United States Patent
Burton et al.

(10) Patent No.: US 12,382,689 B2
(45) Date of Patent: Aug. 5, 2025

(54) METHOD FOR MAKING DMOS DEVICES INCLUDING A SUPERLATTICE AND FIELD PLATE FOR DRIFT REGION DIFFUSION

(71) Applicant: ATOMERA INCORPORATED, Los Gatos, CA (US)

(72) Inventors: Richard Burton, Phoenix, AZ (US); Shuyi Li, Los Gatos, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 18/657,928

(22) Filed: May 8, 2024

(65) Prior Publication Data
US 2024/0379824 A1   Nov. 14, 2024

Related U.S. Application Data

(60) Provisional application No. 63/500,714, filed on May 8, 2023.

(51) Int. Cl.
*H10D 30/01* (2025.01)
*H10D 30/65* (2025.01)
(Continued)

(52) U.S. Cl.
CPC ..... *H10D 62/8181* (2025.01); *H10D 30/0281* (2025.01); *H10D 30/65* (2025.01);
(Continued)

(58) Field of Classification Search
CPC .............. H01L 29/063; H01L 29/0619; H01L 29/0615; H01L 29/0607; H01L 29/0611; H10D 30/0281
See application file for complete search history.

(56) References Cited

U.S. PATENT DOCUMENTS

| 4,937,204 A | 6/1990 | Ishibashi et al. |
| 5,216,262 A | 6/1993 | Tsu |

(Continued)

FOREIGN PATENT DOCUMENTS

| GB | 2347520 | 6/2000 |

OTHER PUBLICATIONS

R. Tsu "Phenomena in silicon nanostructure device" published online Sep. 6, 2000 by Applied Physics and Materials Science & Processing, pp. 391-402.

(Continued)

*Primary Examiner* — Christopher A Johnson
(74) *Attorney, Agent, or Firm* — ALLEN, DYER, DOPPELT, + GILCHRIST, P.A.

(57) ABSTRACT

A method for making a double-diffused MOS (DMOS) device may include forming a semiconductor layer having a first conductivity type, forming a drift region of a second conductivity type in the semiconductor substrate, forming spaced-apart source and drain regions in the semiconductor layer, and forming a first superlattice on the semiconductor layer. The first superlattice may include a plurality of stacked groups of layers, each group of layers including a plurality of stacked base semiconductor monolayers defining a base semiconductor portion, and at least one non-semiconductor monolayer constrained within a crystal lattice of adjacent base semiconductor portions. The method may also include forming a gate above the first superlattice, and a forming field plate layer adjacent the drift region and configured to deplete the drift region.

18 Claims, 11 Drawing Sheets

(51) Int. Cl.
  *H10D 62/10*     (2025.01)
  *H10D 62/17*     (2025.01)
  *H10D 62/815*    (2025.01)
  *H10D 64/00*     (2025.01)

(52) U.S. Cl.
  CPC ......... *H10D 62/111* (2025.01); *H10D 62/393* (2025.01); *H10D 62/815* (2025.01); *H10D 64/111* (2025.01)

(56) References Cited

U.S. PATENT DOCUMENTS

| | | |
|---|---|---|
| 5,357,119 A | 10/1994 | Wang et al. |
| 5,683,934 A | 11/1997 | Candelaria |
| 5,796,119 A | 8/1998 | Seabaugh |
| 6,376,337 B1 | 4/2002 | Wang et al. |
| 6,447,933 B1 | 9/2002 | Wang et al. |
| 6,472,685 B2 | 10/2002 | Takagi |
| 6,613,633 B2 | 9/2003 | Oh |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,402,512 B2 | 7/2008 | Derraa et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,535,041 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,716,147 B2 | 7/2017 | Mears |
| 9,721,790 B2 | 8/2017 | Mears et al. |
| 9,722,046 B2 | 8/2017 | Mears et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Takeuchi et al. |
| 10,608,027 B2 | 3/2020 | Chen et al. |
| 10,608,043 B2 | 3/2020 | Chen et al. |
| 10,615,209 B2 | 4/2020 | Chen et al. |
| 10,636,879 B2 | 4/2020 | Rao |
| 10,727,049 B2 | 7/2020 | Weeks et al. |
| 10,741,436 B2 | 8/2020 | Stephenson et al. |
| 10,763,370 B2 | 9/2020 | Stephenson |
| 10,777,451 B2 | 9/2020 | Stephenson et al. |
| 10,811,498 B2 | 10/2020 | Weeks et al. |
| 10,818,755 B2 | 10/2020 | Takeuchi et al. |
| 10,825,901 B1 | 11/2020 | Burton et al. |
| 10,825,902 B1 | 11/2020 | Burton et al. |
| 10,840,335 B2 | 11/2020 | Takeuchi et al. |
| 10,840,336 B2 | 11/2020 | Connelly et al. |
| 10,840,337 B2 | 11/2020 | Takeuchi et al. |
| 10,840,388 B1 | 11/2020 | Burton et al. |
| 10,847,618 B2 | 11/2020 | Takeuchi et al. |
| 10,854,717 B2 | 12/2020 | Takeuchi et al. |
| 10,868,120 B1 | 12/2020 | Burton et al. |
| 10,879,356 B2 | 12/2020 | Stephenson et al. |
| 10,879,357 B1 | 12/2020 | Burton et al. |
| 10,884,185 B2 | 1/2021 | Stephenson |
| 10,937,868 B2 | 3/2021 | Burton et al. |
| 10,937,888 B2 | 3/2021 | Burton et al. |
| 10,998,416 B2 | 5/2021 | You et al. |
| 11,075,078 B2 | 7/2021 | Cody et al. |
| 11,094,818 B2 | 8/2021 | Takeuchi et al. |
| 11,177,351 B2 | 11/2021 | Weeks et al. |
| 11,183,565 B2 | 11/2021 | Burton et al. |
| 11,302,823 B2 | 4/2022 | Weeks et al. |
| 11,329,154 B2 | 5/2022 | Takeuchi et al. |
| 11,355,667 B2 | 6/2022 | Stephenson |
| 11,362,182 B2 | 6/2022 | Shin et al. |
| 11,387,325 B2 | 7/2022 | Stephenson et al. |
| 11,430,869 B2 | 8/2022 | Weeks et al. |
| 11,437,486 B2 | 9/2022 | Burton |
| 11,437,487 B2 | 9/2022 | Burton |
| 11,469,302 B2 | 10/2022 | Takeuchi et al. |
| 11,569,368 B2 | 1/2023 | Takeuchi et al. |
| 11,631,584 B1 | 4/2023 | Hytha et al. |
| 11,664,427 B2 | 5/2023 | Stephenson et al. |
| 11,664,459 B2 | 5/2023 | Stephenson |
| 11,682,712 B2 | 6/2023 | Hytha et al. |

(56) References Cited

U.S. PATENT DOCUMENTS

| | | |
|---|---|---|
| 11,721,546 B2 | 8/2023 | Hytha et al. |
| 11,728,385 B2 | 8/2023 | Hytha et al. |
| 11,742,202 B2 | 8/2023 | Takeuchi et al. |
| 11,810,784 B2 | 11/2023 | Hytha et al. |
| 11,837,634 B2 | 12/2023 | Weeks et al. |
| 11,848,356 B2 | 12/2023 | Weeks et al. |
| 11,869,968 B2 | 1/2024 | Takeuchi et al. |
| 11,923,418 B2 | 3/2024 | Hytha et al. |
| 11,923,431 B2 | 3/2024 | Burton |
| 11,935,940 B2 | 3/2024 | Burton |
| 11,978,771 B2 | 5/2024 | Weeks et al. |
| 2003/0034529 A1 | 2/2003 | Fitzgerald et al. |
| 2003/0057416 A1 | 3/2003 | Currie et al. |
| 2004/0262594 A1 | 12/2004 | Mears et al. |
| 2004/0266116 A1 | 12/2004 | Mears |
| 2005/0029510 A1 | 2/2005 | Mears et al. |
| 2005/0032241 A1 | 2/2005 | Mears et al. |
| 2005/0279991 A1 | 12/2005 | Mears et al. |
| 2005/0282330 A1 | 12/2005 | Mears et al. |
| 2006/0011905 A1 | 1/2006 | Mears et al. |
| 2006/0220118 A1 | 10/2006 | Stephenson et al. |
| 2006/0223215 A1 | 10/2006 | Blanchard |
| 2006/0231857 A1 | 10/2006 | Blanchard |
| 2006/0243964 A1 | 11/2006 | Kreps et al. |
| 2006/0263980 A1 | 11/2006 | Kreps et al. |
| 2006/0267130 A1 | 11/2006 | Rao |
| 2006/0273299 A1 | 12/2006 | Stephenson et al. |
| 2006/0289049 A1 | 12/2006 | Rao |
| 2006/0292765 A1 | 12/2006 | Blanchard |
| 2007/0010040 A1 | 1/2007 | Mears et al. |
| 2007/0012910 A1 | 1/2007 | Mears et al. |
| 2007/0015344 A1 | 1/2007 | Mears et al. |
| 2007/0020833 A1 | 1/2007 | Mears et al. |
| 2007/0020860 A1 | 1/2007 | Mears et al. |
| 2007/0063185 A1 | 3/2007 | Rao |
| 2007/0063186 A1 | 3/2007 | Rao |
| 2007/0158640 A1 | 7/2007 | Stephenson et al. |
| 2007/0166928 A1 | 7/2007 | Halilov et al. |
| 2007/0187667 A1 | 8/2007 | Halilov et al. |
| 2008/0012004 A1 | 1/2008 | Huang et al. |
| 2009/0152627 A1* | 6/2009 | Kikuchi ............... H10D 62/393 257/E29.256 |
| 2010/0270535 A1 | 10/2010 | Halilov et al. |
| 2011/0215299 A1 | 9/2011 | Rao |
| 2019/0058059 A1 | 2/2019 | Stephenson et al. |
| 2020/0135489 A1 | 4/2020 | Weeks et al. |
| 2020/0343380 A1* | 10/2020 | Takeuchi ............ H01L 29/7835 |
| 2020/0373395 A1* | 11/2020 | Ho ..................... H01L 29/7816 |
| 2022/0005706 A1 | 1/2022 | Weeks et al. |
| 2022/0278204 A1 | 9/2022 | Shin et al. |
| 2022/0285152 A1 | 9/2022 | Takeuchi et al. |
| 2022/0352322 A1 | 11/2022 | Hytha et al. |
| 2022/0367676 A1 | 11/2022 | Burton |
| 2022/0376047 A1 | 11/2022 | Mears et al. |
| 2022/0384600 A1 | 12/2022 | Mears et al. |
| 2023/0122723 A1 | 4/2023 | Weeks et al. |
| 2023/0352299 A1 | 11/2023 | Takeuchi et al. |
| 2023/0361178 A1 | 11/2023 | Hytha et al. |
| 2023/0395374 A1 | 12/2023 | Hytha et al. |
| 2023/0411491 A1 | 12/2023 | Hytha et al. |
| 2023/0411557 A1 | 12/2023 | Hytha et al. |
| 2024/0047529 A1* | 2/2024 | Lee ..................... H01L 29/0649 |
| 2024/0063268 A1 | 2/2024 | Weeks et al. |
| 2024/0072095 A1 | 2/2024 | Takeuchi et al. |
| 2024/0072096 A1 | 2/2024 | Takeuchi et al. |
| 2024/0097003 A1 | 3/2024 | Burton |
| 2024/0097026 A1 | 3/2024 | Takeuchi et al. |

OTHER PUBLICATIONS

Xu et al., "MOSFET performance and scalability enhancement by insertion of oxygen layers", Department of Electrical Engineering and Computer Science, University of California, Berkeley, 2012, pp. 1-4.

Luo et al., "Chemical Design of Direct-Gap Light-Emitting Silicon" published in Physical Review Letters, vol. 89, No. 7; Aug. 12, 2002; 4 pgs.

R. Tsu "Si Based Green ELD: Si-Oxygen Superlattice" ysiwyg://1/ http://www3.interscience.wiley.com/cgi-bin/abstract/72512946/ start: published online Jul. 21, 2000; 2 pgs. Abstract Only.

Novikov et al. "Silicon-based Optoelectronics" 1999-2003, pp. 1-6.

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.

Maurizio Di Paolo Emilio "Quantum-Engineered Material Boosts Transistor Performance" https://www.eetimes.com/quantum-engineered-material-boosts-transistor-performance/# EE Times; retreived from internet Feb. 10, 2022; pp. 3.

U.S. Appl. No. 18/657,898; Filed May 8, 2024 Burton et al.

* cited by examiner

METHOD FOR MAKING DMOS DEVICES INCLUDING A SUPERLATTICE AND FIELD PLATE FOR DRIFT REGION DIFFUSION

CROSS-REFERENCE TO RELATED APPLICATIONS

This application claims the benefit of U.S. provisional app. No. 63/500,714 filed May 8, 2023, which is hereby incorporated herein in its entirety by reference.

TECHNICAL FIELD

The present disclosure generally relates to semiconductor devices, and, more particularly, to double-diffused metal oxide semiconductor (DMOS) devices and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a double-diffused MOS (DMOS) device may include forming a semiconductor layer having a first conductivity type, forming a drift region of a second conductivity type in the semiconductor substrate, forming spaced-apart source and drain regions in the semiconductor layer, and forming a first superlattice on the semiconductor layer. The first superlattice may include a plurality of stacked groups of layers, each group of layers including a plurality of stacked base semiconductor monolayers defining a base semiconductor portion, and at least one non-semiconductor monolayer constrained within a crystal lattice of adjacent base semiconductor portions. The method may also include forming a gate above the first superlattice, and a forming field plate layer adjacent the drift region and configured to deplete the drift region.

In an example embodiment, the method may further include forming a second superlattice in the semiconductor layer beneath the drift region. The second superlattice may include a plurality of stacked groups of layers, with each group of layers including a plurality of stacked base semiconductor monolayers defining a base semiconductor portion, and at least one non-semiconductor monolayer constrained within a crystal lattice of adjacent base semiconductor portions. Furthermore, the method may also include forming at least one resurf region in the substrate below the second superlattice. In an example implementation, the at least one resurf region may comprise a lower resurf region, and an upper resurf region between the lower resurf region and the second superlattice. Additionally, the method may further include forming a semiconductor cap layer on the first superlattice and defining a channel between the source and drain regions.

In an example implementation, the field plate layer may be electrically coupled with the source region. In some embodiments, the method may further include forming a body implant in the semiconductor layer adjacent the source region. In an example embodiment, the gate may comprise a gate dielectric layer on the semiconductor layer and gate electrode layer on the gate dielectric layer, and the gate dielectric layer may have first and second portions, with the second portion being thicker than the first portion. By way of example, the base semiconductor monolayers may comprise silicon, and the non-semiconductor monolayers may comprise oxygen.

DETAILED DESCRIPTION

Figure 1:
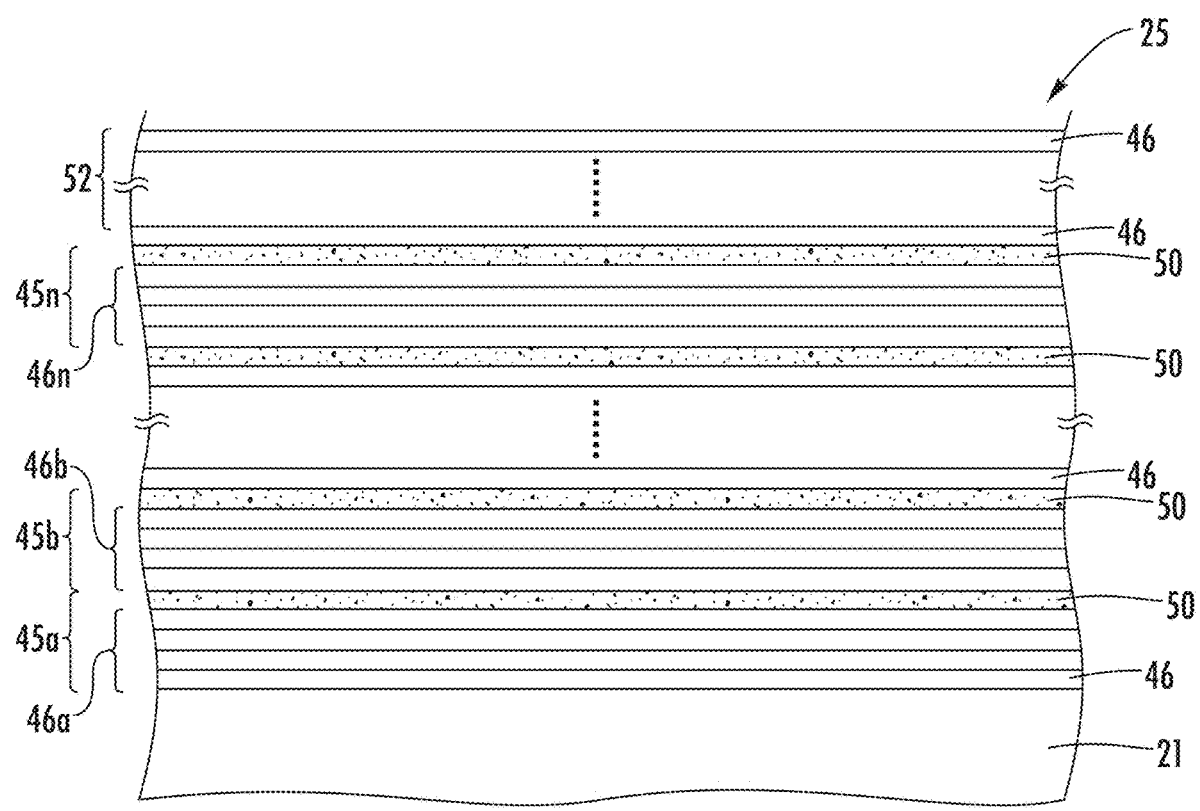
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to semiconductor devices having an enhanced semiconductor superlattice therein to provide performance enhancement characteristics. The enhanced semiconductor superlattice may also be referred to as an "MST" layer or "MST technology" in this disclosure.

More particularly, the MST technology relates to advanced semiconductor materials such as the superlattice 25 described further below. In prior work, Applicant theorized that certain superlattices as described herein reduce the effective mass of charge carriers and that this thereby leads to higher charge carrier mobility. See, e.g., U.S. Pat. No. 6,897,472, which is hereby incorporate herein in its entirety by reference.

Further development by Applicant has established that the presence of MST layers may advantageously improve the mobility of free carriers in semiconductor materials, e.g., at interfaces between silicon and insulators like $SiO_2$ or $HfO_2$. Applicant theorizes, without wishing to be bound thereto, that this may occur due to various mechanisms. One mechanism is by reducing the concentration of charged impurities proximate to the interface, by reducing the diffusion of these impurities, and/or by trapping the impurities so they do not reach the interface proximity. Charged impurities cause Coulomb scattering, which reduces mobility. Another mechanism is by improving the quality of the interface. For example, oxygen emitted from an MST film may provide oxygen to a Si—$SiO_2$ interface, reducing the presence of sub-stoichiometric $SiO_x$. Alternately, the trapping of interstitials by MST layers may reduce the concentration of interstitial silicon proximate to the Si—$SiO_2$ interface, reducing the tendency to form sub-stoichiometric $SiO_x$. Sub-stoichiometric SiO, at the Si—$SiO_2$ interface is known to exhibit inferior insulating properties relative to stoichiometric $SiO_2$. Reducing the amount of sub-stoichiometric $SiO_x$ at the interface may more effectively confine free carriers (electrons or holes) in the silicon, and thus improve the mobility of these carriers due to electric fields applied parallel to the interface, as is standard practice in field-effect-transistor ("FET") structures. Scattering due to the direct influence of the interface is called "surface-roughness scattering", which may advantageously be reduced by the proximity of MST layers followed by anneals or during thermal oxidation.

In addition to the enhanced mobility characteristics of MST structures, they may also be formed or used in such a manner that they provide piezoelectric, pyroelectric, and/or ferroelectric properties that are advantageous for use in a variety of different types of devices, as will be discussed further below.

Figure 2:
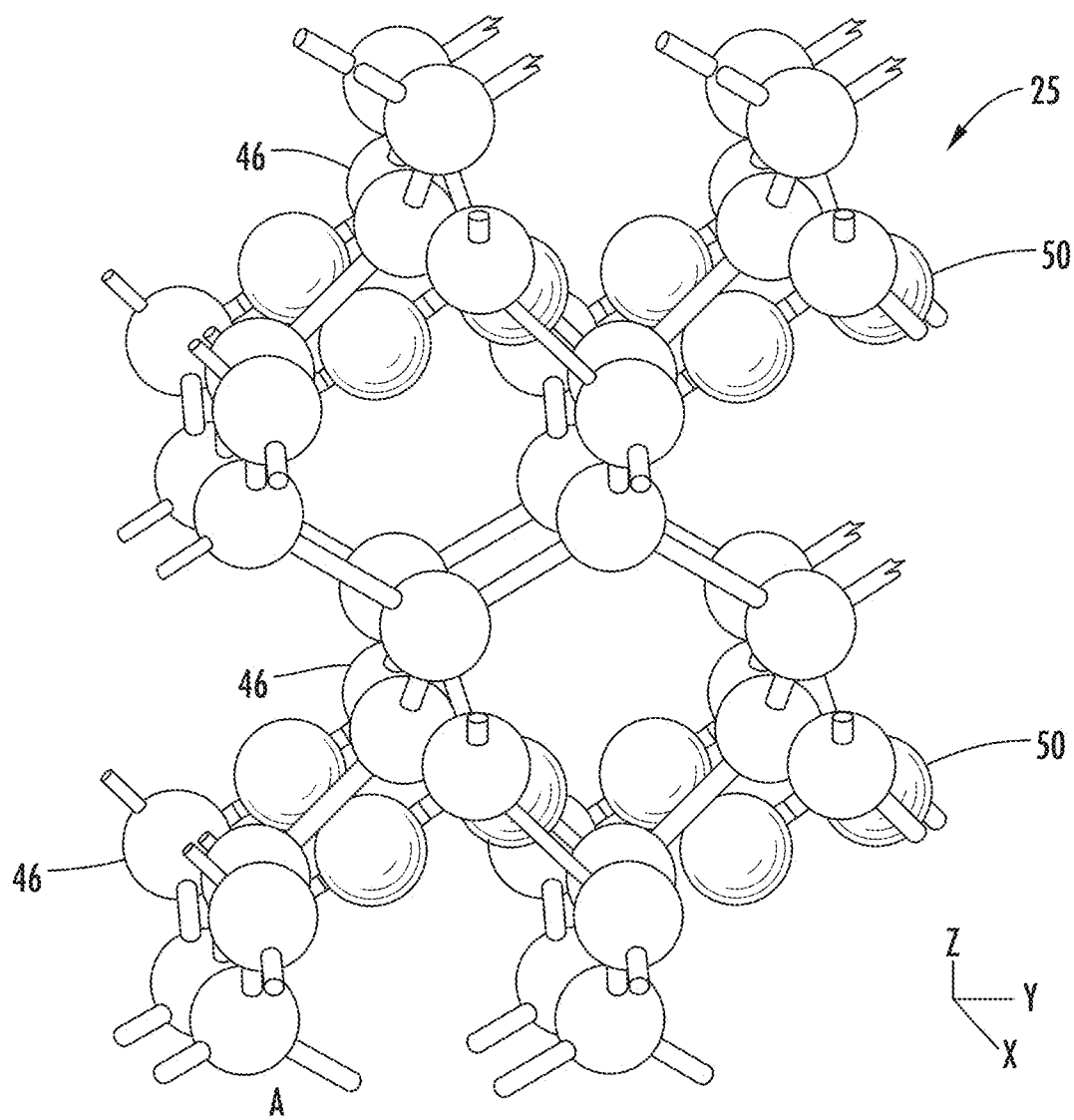
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and a non-semiconductor monolayer(s) 50 thereon. The non-semiconductor monolayers 50 are indicated by stippling in FIG. 1 for clarity of illustration.

The non-semiconductor monolayer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that non-semiconductor monolayers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present embodiments, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each non-semiconductor monolayer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the non-semiconductor monolayer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the embodiments may be readily adopted and implemented, as will be appreciated by those skilled in the art.

Figure 3:
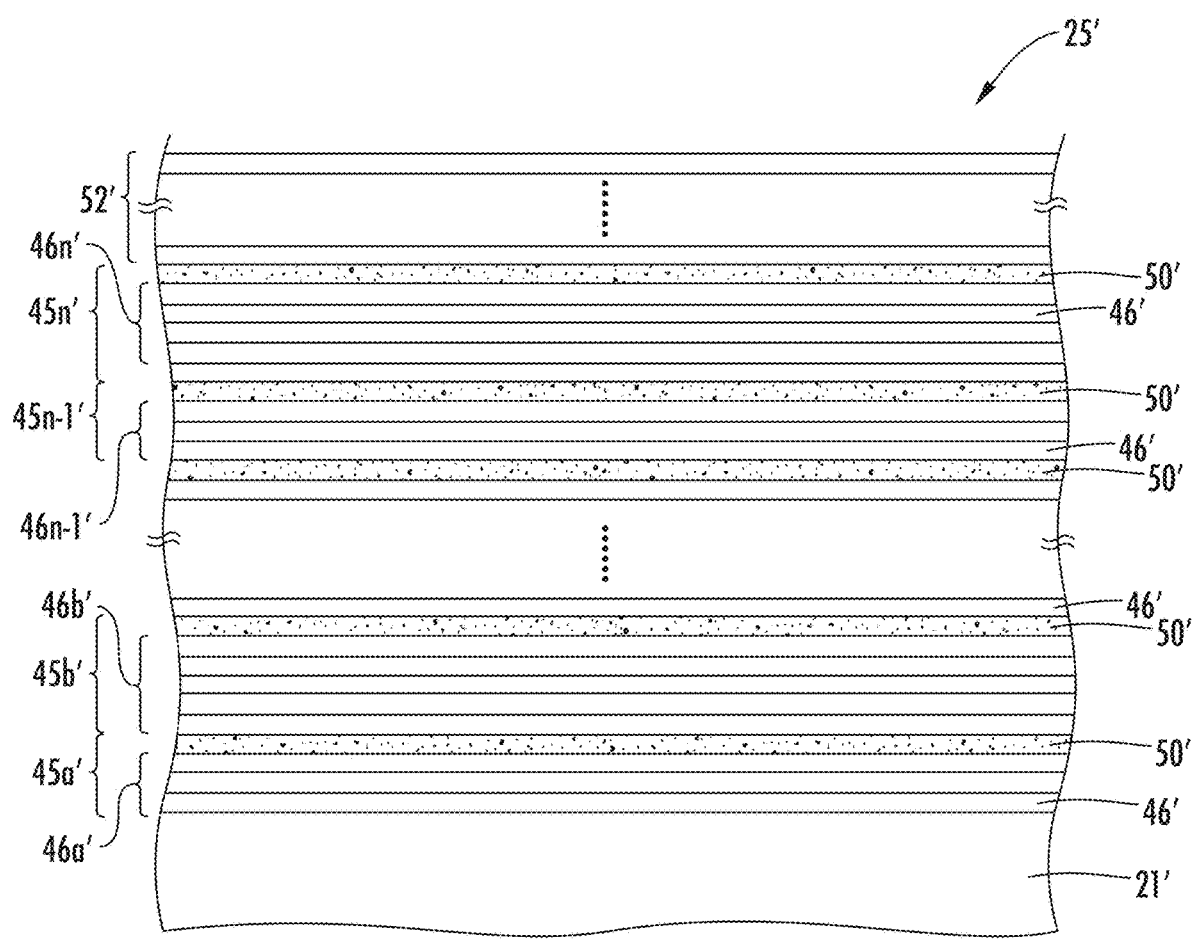
FIG. 3 is a greatly enlarged schematic cross-sectional view of another embodiment of a superlattice in accordance with an example embodiment.

Referring now additionally to FIG. 3, another embodiment of a superlattice 25' in accordance with the embodiments having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The non-semiconductor monolayers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4:
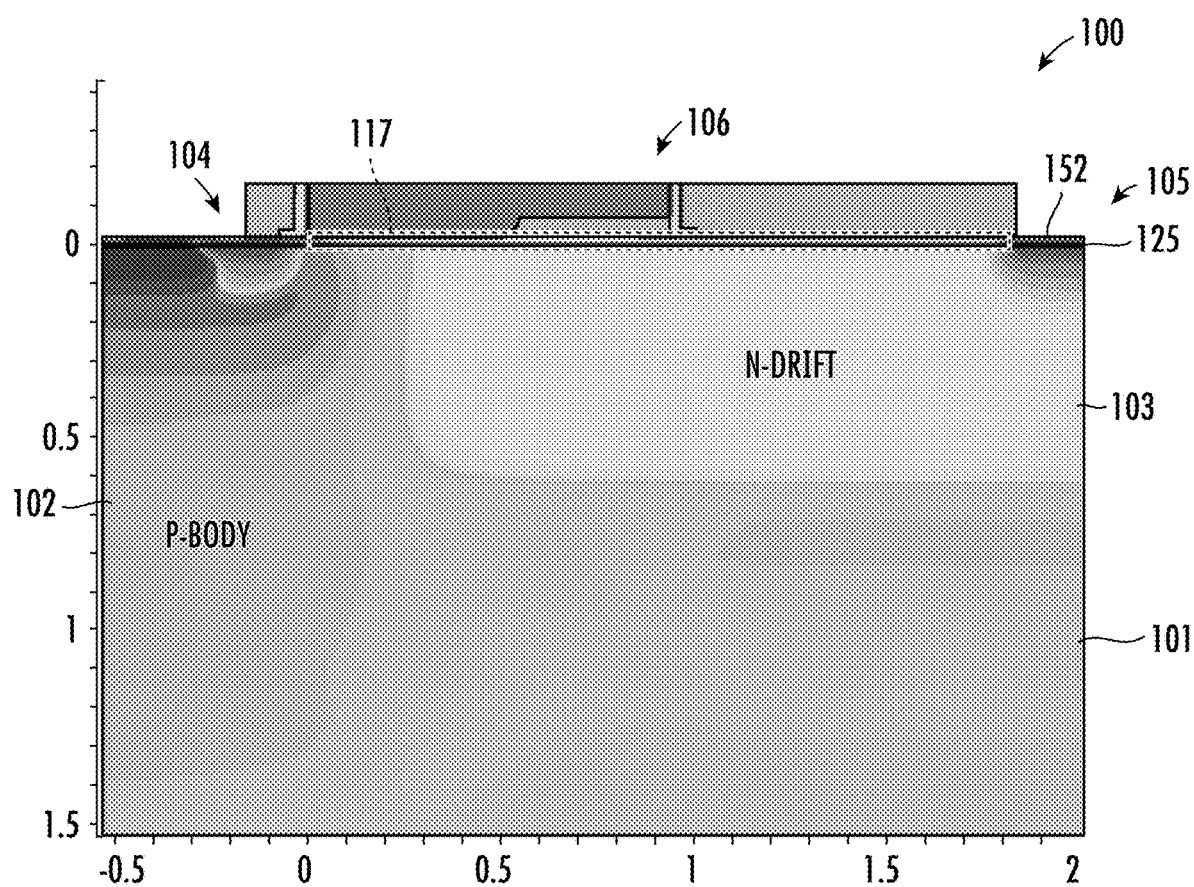
FIGS. 4-7 are schematic cross-sectional diagrams of various DMOS devices including one or more superlattice layers in different example embodiments.

Turning to FIG. 4, an example double-diffused MOS (DMOS) device 100 which incorporates the above-described MST technology is now described. The DMOS 100 illustratively includes a substrate 101, in which shallow P and N regions 102, 103 are formed, as well as source and drain implants 104, 105, respectively. An MST film 125 is formed on the upper surface of the substrate 101, along with a cap layer 152 which may define the channel of the device beneath a gate 106. In some embodiments, the channel may also extend into the MST film 125. By way of example, the cap layer 152 may have a thickness in a range of 5 nm to 100 nm, and the shallow N region 103 may have a thickness in a range of 100 nm to 1000 nm, although other dimensions may be used in different embodiments.

As previously noted, the above-described MST films may advantageously provide intrinsic mobility in certain configurations via the energy band-modifying effect. However, in the present application the improved performance of the DMOS device 100 is achieved as a result of the modified doping profile that is achievable because of the presence of the MST film 125. This leads to increased mobility due to lower surface roughness scattering, lower coulombic scattering, and increased conduction in the near surface region 117. In other words, this technical advantage may be achieved irrespective of, and is not reliant upon, the energy band-modifying capabilities of MST films.

Figure 5:
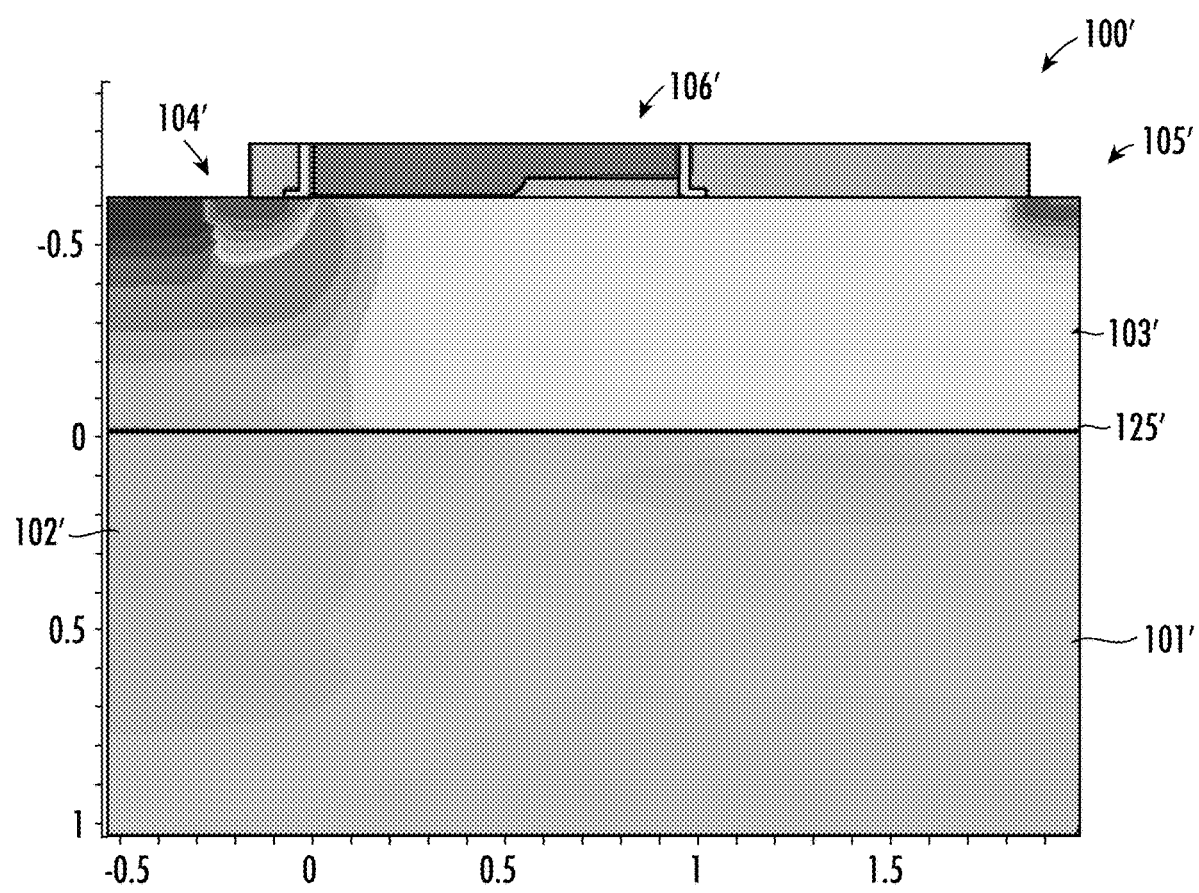

Referring now to FIG. 5, in an alternative embodiment of the DMOS device 101' the MST layer 125' is buried in the substrate 101', as opposed to being on the surface of the substrate as in the DMOS device 100 described above. In still another example embodiment of the DMOS device 101" illustrated in FIG. 6, a dual-layer MST configuration is provided which includes both a buried (lower) MST layer 125a" and a surface (upper) MST layer 125b".

Figure 7:
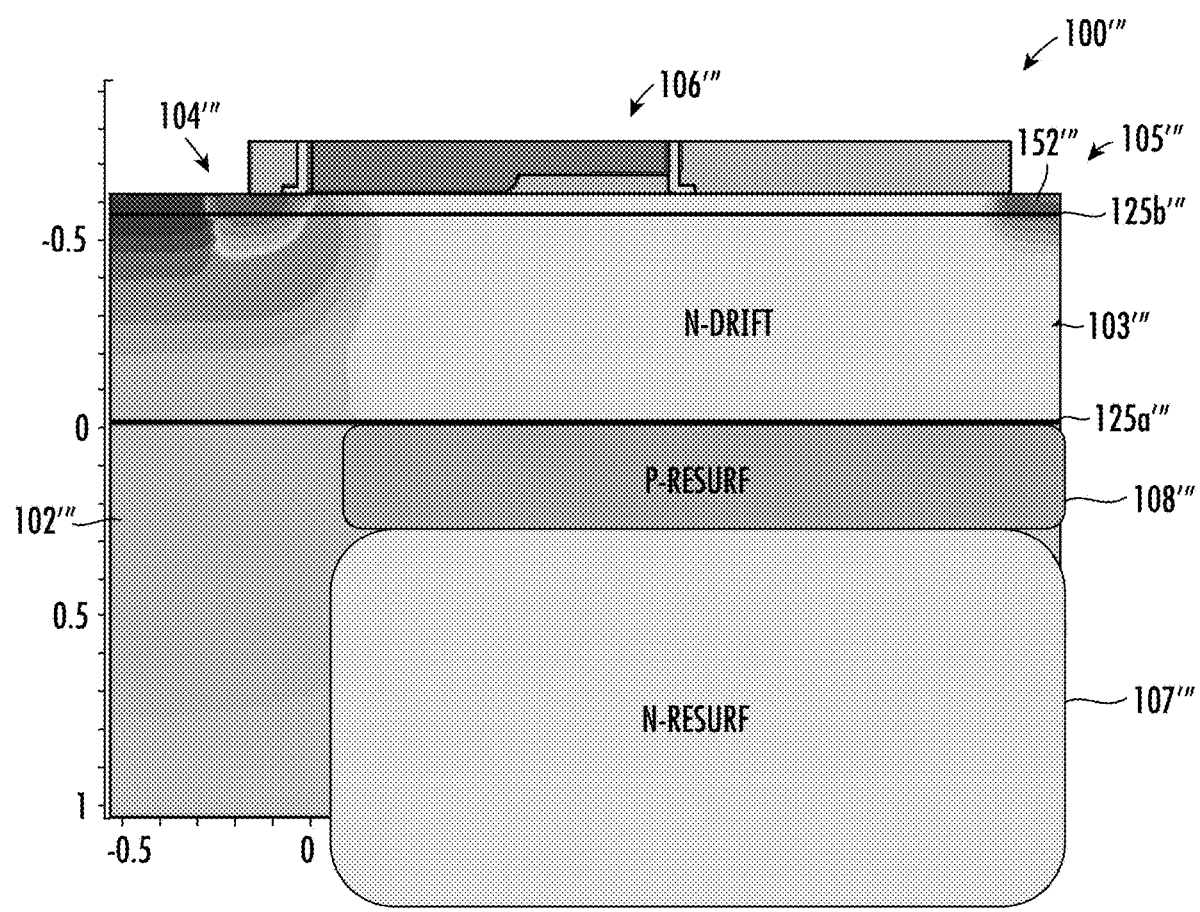

Referring to FIG. 7, still another dual-layer MST DMOS device 100''' includes double resurf N and P regions 107''', 108'''. This configuration provides for a thinner drift enabled by the double resurf and double MST layer 125a''', 125b''' configuration. Furthermore, the MST layer 125a''' advantageously reduces compensation of the drift region by the resurf doping, as will be appreciated by those skilled in the art. In some embodiments, the N and P resurf implants 107''', 108''' may be implemented using the same mask as the drift mask to advantageously reduce cost. The resurf N region 107''' may be connected to the drain region 105'''.

Figure 8:
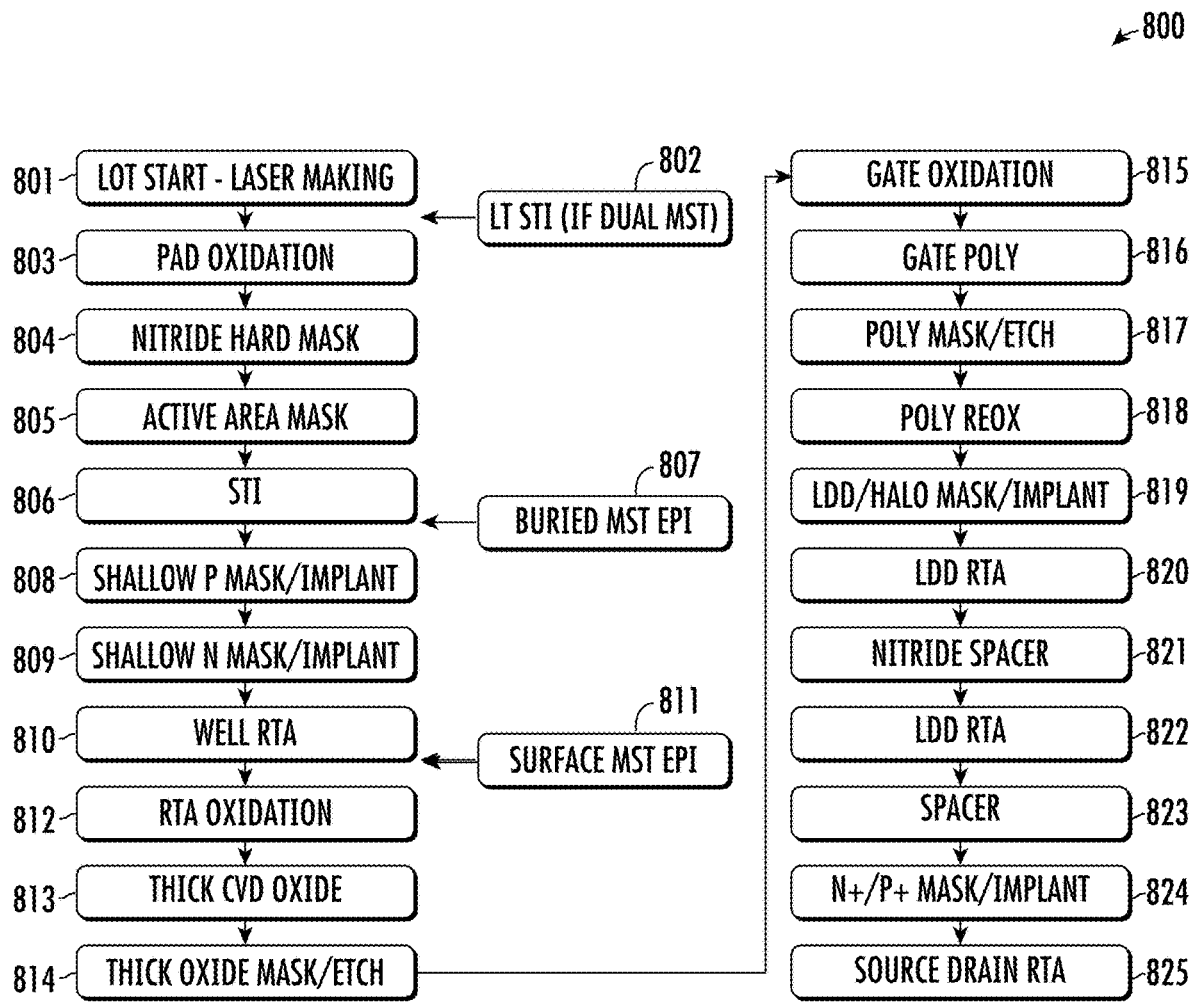
FIG. 8 is a process flow diagram illustrating method aspects associated with the fabrication of the DMOS devices of FIGS. 5-8.

An example approach for fabricating the above-noted DMOS devices 100-100''' is now described with reference to the process flow diagram 800 of FIG. 8. The lot starts with a laser processing module 801. If either of the dual MST layer DMOS devices 100" or 100''' is to be formed, then a low temperature (LT) shallow trench isolation (STI) module 802 is performed. Otherwise, the process proceeds to a pad oxidation module 803, followed by a nitride hard mask module 804 and an active area mask module 805. A shallow trench isolation (STI) module 806 is then performed.

If one of the DMOS devices 100', 100", or 100''' is being fabricated, then a buried MST epitaxial module 207 807 is performed after the STI module 806. Otherwise, processing proceeds to the shallow P and N mask/implant modules 808, 809 respectively, and a well rapid thermal anneal (RTA) module 810. If one of the DMOS devices 100, 100", or 100''' is being fabricated, then a surface MST epitaxial module 811 is performed after the well RTA module 810. The process continues with an RTA oxidation module 812, thick chemical vapor deposition (CVD) oxide module 813, and thick oxide mask/etch module 814. Gate formation includes a gate oxidation module 815, gate polysilicon deposition module 816, a poly mask/etch module 817, and a poly reoxidation module 818. The method further illustratively includes a lightly doped drain (LDD)/halo mask/implant module 819, LDD RTA module 820, nitride spacer module 821, and/or other LDD RTA module 822, spacer formation module 823, N+/P+ mask/implant module 224 824, and source/drain RTA module 825.

In the above described DMOS devices with a surface MST layer, the MST surface layer enables a retrograde profile near the surface of the substrate, resulting in higher mobility (lower coulomb scattering). Furthermore, the MST surface layers improve mobility below/near gate oxide interface due to lower Surface Roughness Scattering (SRS). Another technical advantage is that the MST layers enable tailoring of doping profiles to direct current flow away from the drift region interface in case of high interface charge. Furthermore, the MST layers advantageously enable preventing compensation of the drift region by resurf region doping, resulting in higher bulk mobility. This allows for a thinner drift region as compared to conventional devices.

Figure 9A:
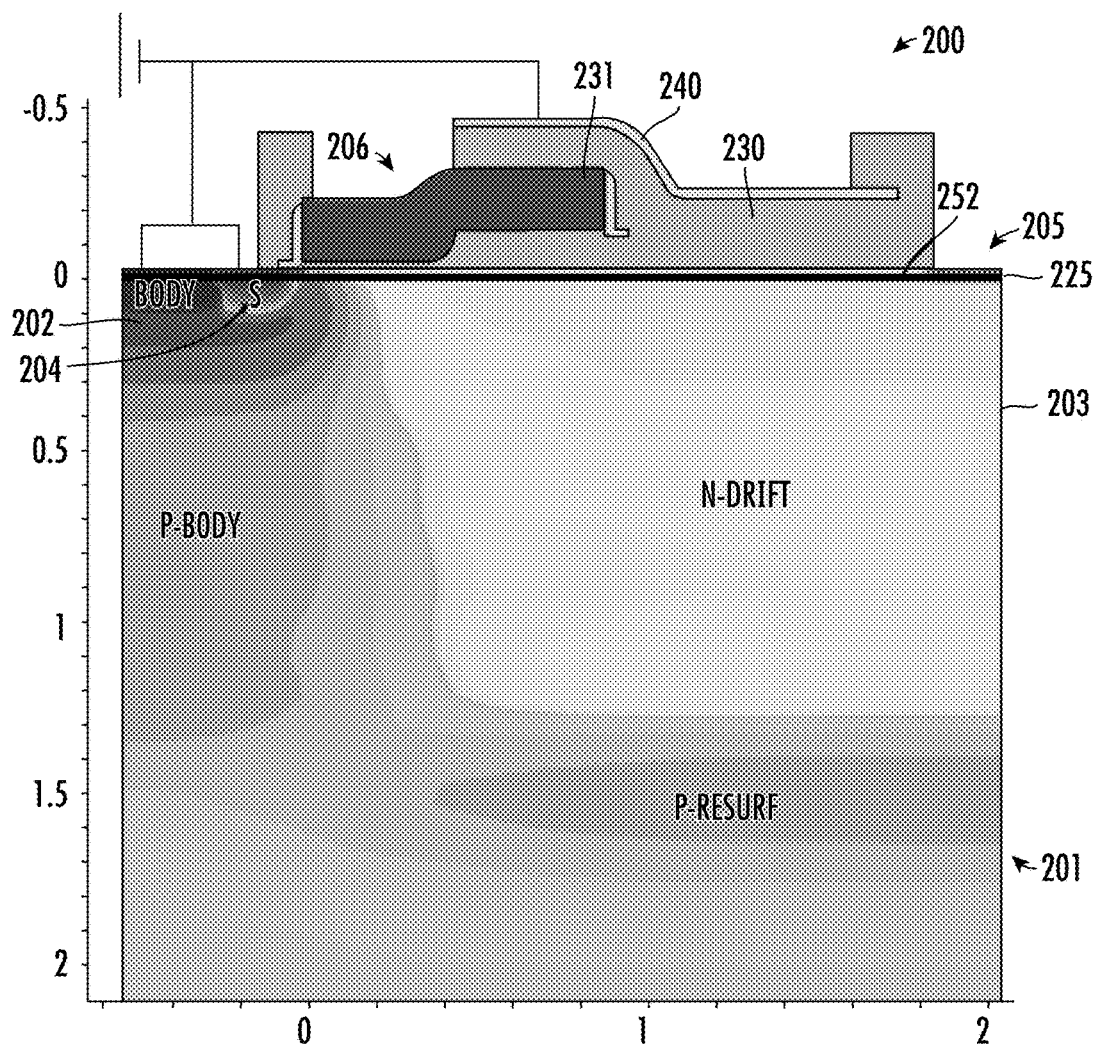
FIG. 9A is a schematic cross-sectional diagram of an alternative embodiment of the DMOS device of FIG. 4 including a field plate for drift region depletion.
Figure 9B:
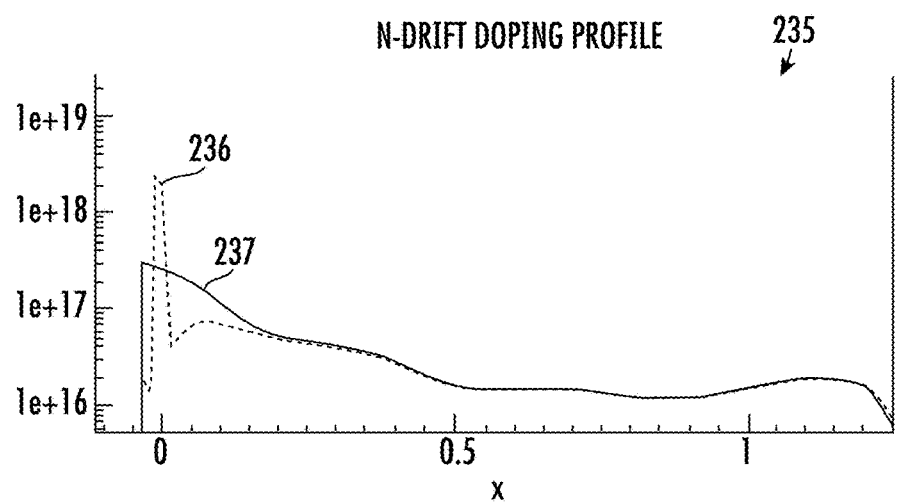
FIG. 9B is a doping profile graph illustrating dopant concentration vs. depth for an example implementation of the DMOS device of FIG. 9A, as well as for a similar device without a superlattice layer.

Turning now to FIG. 9A, another example DMOS device 200 is described. The DMOS 200 is similar to the DMOS device 100 and illustratively includes a substrate 201, in which shallow P (body) region 202 and shallow N (drift) region 203 are formed, as well as source and drain implants 204, 205, respectively. An MST film 225 is formed on the upper surface of the substrate 201, along with a cap layer 252 which may define the channel of the device beneath a gate 206. Here, the gate has a stepped gate oxide layer 230 with a thinner first portion and a thicker second portion, and a gate electrode layer 231 on the stepped gate oxide layer. As noted above, in some embodiments the channel may also extend into the MST film 225. The cap layer 252 and drift region 203 may have similar dimensions to those described above.

This configuration provides numerous technical advantages. In particular, the dopant retention characteristics of the MST film 225 enable a steeper doping profile concentrated in the drift region as compared to a similar device without such an MST layer, as seen in the plot lines 236 and 237 of the graph 235 of FIG. 9A. The resulting doping profile advantageously provides a relatively low drift resistance path, as will be appreciated by those skilled in the art.

The DMOS 200 also illustratively includes a conductive field plate 240 (e.g., a tungsten plug field plate) over the gate 206 adjacent to the drift region 203. This provides another significant technical advantage, in that it allows the drain-source breakdown voltage BVdss to remain unaffected. This is because the drift region is fully depleted from the top by the field plate 240, which is grounded along with the source region 204 and body implant region 202. Moreover, the drift region may also be depleted from the bottom by the P-RESURF implant as well.

Figure 6:
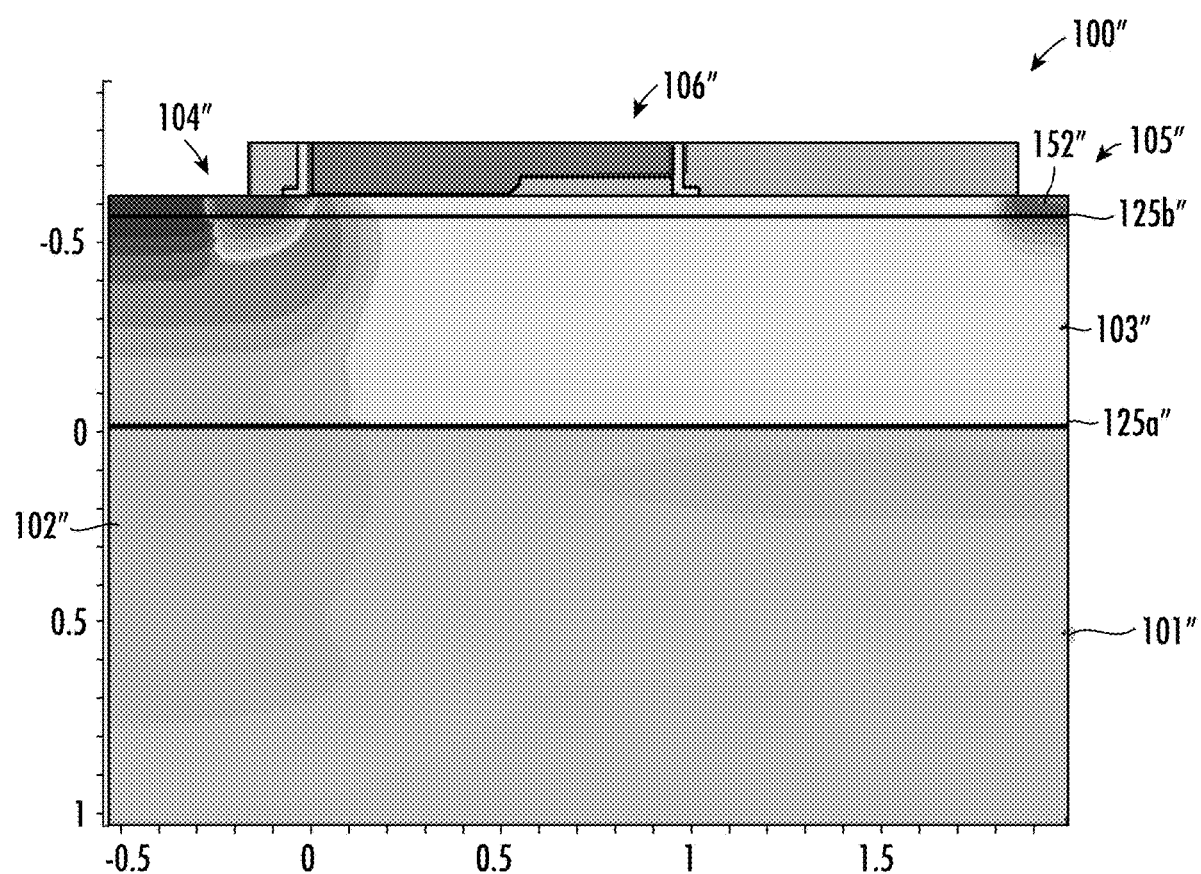
Figure 10:
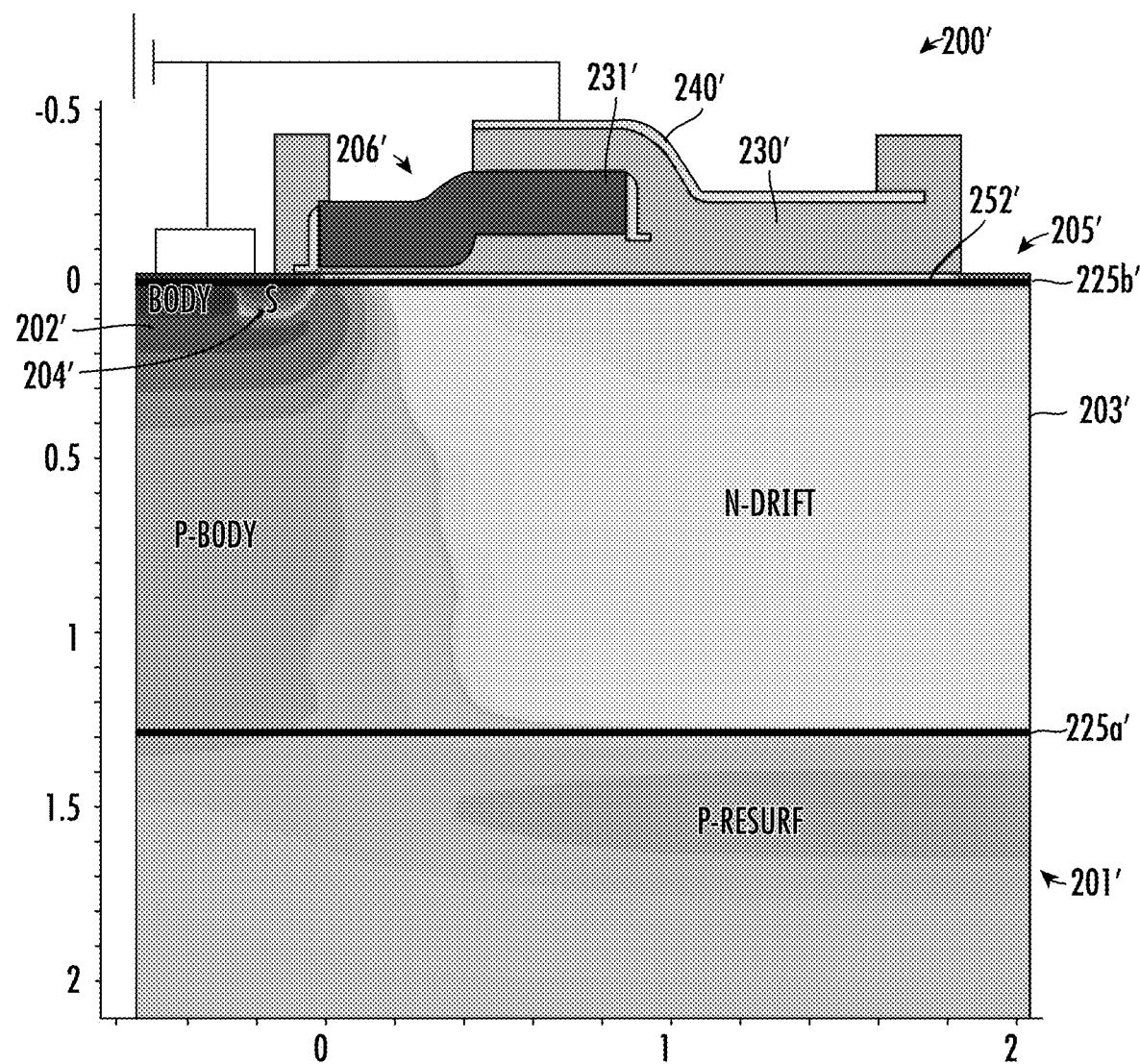
FIG. 10 is a schematic cross-sectional diagram of an alternative embodiment of the DMOS device of FIG. 6 including a field plate for drift region depletion.

Referring now to FIG. 10, in an alternative embodiment of the DMOS device 201', a dual-layer MST configuration is provided which includes both a buried (lower) MST layer 225a' and a surface (upper) MST layer 225b', as similarly described with reference to FIG. 6 above. This embodiment also provides a technical advantage of Ron resistance reduction, as the lower MST layer 225a' helps prevent intermixing of N-drift and P-RESURF dopants. In some embodiments, only the buried MST layer 225a' may be present (similar to the embodiment described with reference to FIG. 7 above).

Figure 11:
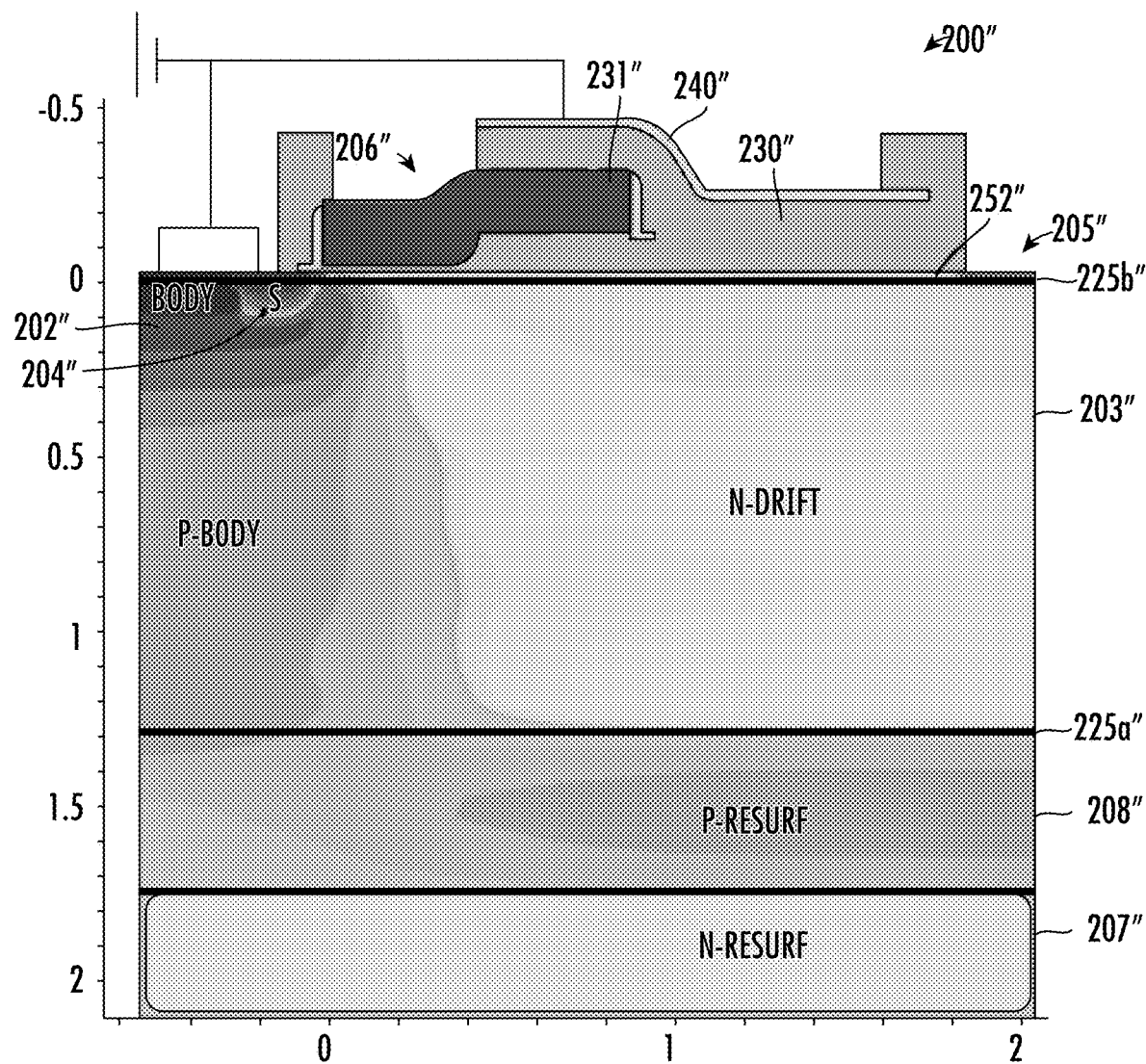
FIG. 11 is a schematic cross-sectional diagram of an alternative embodiment of the DMOS device of FIG. 7 including a field plate for drift region depletion.

Referring to FIG. 11, still another dual-layer MST DMOS device 200" includes double resurf N and P regions 207", 208". As discussed above with reference to FIG. 7, this provides for a thinner drift region 203" enabled by the double resurf and double MST layer 225a", 125b" configuration. Furthermore, the MST layer 125a" advantageously reduces compensation of the drift region by the resurf doping, as will be appreciated by those skilled in the art. Here again, in some embodiments the N and P resurf implants 207", 208" may be implemented using the same mask as the drift mask to advantageously reduce cost, and resurf N region 207" may be connected to the drain region 205". This configuration also provides for significant Ron and BVdss improvement. That is, the MST-enabled P—N super junction RESURF configuration allows lower Ron and higher BV due to a reduction of dopant intermixing, as well as a larger vertical depletion region, as will be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A method for making a double-diffused MOS (DMOS) device comprising:
    forming a semiconductor layer having a first conductivity type;
    forming a drift region of a second conductivity type in the semiconductor layer;
    forming spaced-apart source and drain regions in the semiconductor layer;
    forming a first superlattice on the semiconductor layer, the first superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;
    forming a gate above the first superlattice;
    forming a field plate layer extending above the gate and adjacent the drift region and configured to deplete the drift region; and
    forming a second superlattice in the semiconductor layer beneath the drift region, the second superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

2. The method of claim 1 further comprising forming at least one resurf region in the substrate below the second superlattice.

3. The method of claim 2 wherein the at least one resurf region comprises a lower resurf region, and an upper resurf region between the lower resurf region and the second superlattice.

4. The method of claim 1 further comprising forming a semiconductor cap layer on the first superlattice and defining a channel between the source and drain regions.

5. The method of claim 1 wherein the field plate layer is electrically coupled with the source region.

6. The method of claim 1 further comprising forming a body implant in the semiconductor layer adjacent the source region.

7. The method of claim 1 wherein forming the gate comprises forming a gate dielectric layer on the semiconductor layer and gate electrode layer on the gate dielectric layer; and wherein the gate dielectric layer has first and second portions, with the second portion being thicker than the first portion.

8. The method of claim 1 wherein the base semiconductor monolayers comprise silicon.

9. The method of claim 1 wherein the non-semiconductor monolayers comprise oxygen.

10. A method for making a double-diffused MOS (DMOS) device comprising:
    forming a semiconductor layer having a first conductivity type, and forming a lower superlattice in the semiconductor layer;
    forming a drift region of a second conductivity type in the semiconductor layer;
    forming spaced-apart source and drain regions in the semiconductor layer;
    forming an upper superlattice on the semiconductor layer;
    forming a gate above the upper superlattice;
    forming a field plate layer adjacent the drift region electrically coupled with the source region and configured to deplete the drift region; and
    each of the lower and upper superlattices comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

11. The method of claim 10 further comprising at least one resurf region in the substrate below the lower superlattice.

12. The method of claim 11 wherein the at least one resurf region comprises a lower resurf region, and an upper resurf region between the lower resurf region and the lower superlattice.

13. The method of claim 10 further comprising a semiconductor cap layer on the upper superlattice and defining a channel between the source and drain regions.

14. The method of claim 10 further comprising forming a body implant in the semiconductor layer adjacent the source region.

15. The method of claim 10 wherein forming the gate comprises forming a gate dielectric layer on the semiconductor layer and gate electrode layer on the gate dielectric layer; and wherein the gate dielectric layer has first and second portions, with the second portion being thicker than the first portion.

16. A method for making a double-diffused MOS (DMOS) device comprising:
    forming a semiconductor layer having a first conductivity type;
    forming a drift region of a second conductivity type in the semiconductor layer;
    forming spaced-apart source and drain regions in the semiconductor layer;
    forming a first superlattice on the semiconductor layer, the first superlattice comprising a plurality of stacked groups of layers, each group of layers comprising a plurality of stacked base silicon monolayers defining a base silicon portion, and at least one oxygen monolayer constrained within a crystal lattice of adjacent base semiconductor portions;
    forming a gate above the first superlattice;
    forming a field plate layer extending above the gate and adjacent the drift region and configured to deplete the drift region; and forming a second superlattice in the semiconductor layer beneath the drift region, the second superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

17. The method of claim 16 further comprising forming at least one resurf region in the substrate below the second superlattice.

18. The method of claim 17 wherein the at least one resurf region comprises a lower resurf region, and an upper resurf region between the lower resurf region and the second superlattice.

* * * * *